US012617671B2

(12) United States Patent
Reinmuth

(10) Patent No.: US 12,617,671 B2
(45) Date of Patent: May 5, 2026

(54) MICROMECHANICAL SENSOR ELEMENT

(71) Applicant: Robert Bosch GmbH, Stuttgart (DE)

(72) Inventor: Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 510 days.

(21) Appl. No.: 17/452,929

(22) Filed: Oct. 29, 2021

(65) Prior Publication Data

US 2022/0144623 A1    May 12, 2022

(30) Foreign Application Priority Data

Nov. 9, 2020    (DE) ..................... 10 2020 214 019.7

(51) Int. Cl.
B81B 3/00        (2006.01)
G01P 15/125      (2006.01)

(52) U.S. Cl.
CPC .......... B81B 3/0027 (2013.01); G01P 15/125 (2013.01); B81B 2201/0235 (2013.01); B81B 2203/04 (2013.01)

(58) Field of Classification Search
CPC .......... B81B 2201/0235; B81B 3/0027; B81B 2203/04; B81B 2203/0136; G01P 15/125
See application file for complete search history.

(56) References Cited

U.S. PATENT DOCUMENTS

2005/0235751 A1*  10/2005  Zarabadi ............. G01P 15/0802
                                                          73/514.01
2006/0272411 A1   12/2006  Acar et al.

2010/0281977 A1   11/2010  Coronato et al.
2011/0030473 A1*   2/2011  Acar ..................... G01P 15/125
                                                          73/504.12
2011/0056295 A1*   3/2011  Classen ............... G01P 15/0802
                                                          73/514.32
2012/0116707 A1*   5/2012  Malvern ................. G01P 21/00
                                                          73/1.38

(Continued)

FOREIGN PATENT DOCUMENTS

DE          10300682 A1    7/2003

*Primary Examiner* — Britt Hanley
*Assistant Examiner* — Casey Paul Boatman
(74) *Attorney, Agent, or Firm* — NORTON ROSE FULBRIGHT US LLP

(57)            ABSTRACT

A micromechanical sensor element includes a substrate, a first structure movably arranged on the substrate, a second structure movably arranged on the substrate and an electrode arrangement, situated on the substrate in a fixed manner, which includes at least one first electrode. The movably arranged structures are coupled with each other by at least one coupling element in such a way that, upon a deflection of the first movably arranged structure along a first direction, the second movably arranged structure undergoes a deflection along an opposite direction. The first electrode includes a plurality of electrode surfaces. The movably arranged structures each include a plurality of movable electrode surfaces. The substrate-fixed electrode surfaces and the movable electrode surfaces engage with each other. The movable electrode surfaces are each situated on sides of the electrode surfaces of the substrate-fixed electrode arrangement facing away from the movably arranged structures.

13 Claims, 5 Drawing Sheets

(56) References Cited

U.S. PATENT DOCUMENTS

| | | | | |
|---|---|---|---|---|
| 2014/0352431 | A1 * | 12/2014 | Leclerc | G01P 15/18 |
| | | | | 73/504.04 |
| 2015/0316378 | A1 | 11/2015 | Kergueris et al. | |
| 2016/0370180 | A1 | 12/2016 | Naumann | |
| 2016/0377649 | A1 * | 12/2016 | Rytkönen | G01C 9/06 |
| | | | | 73/514.32 |
| 2020/0132716 | A1 * | 4/2020 | Zhang | G01P 15/125 |

* cited by examiner

1

9

12    11    10    13

5

19    5    6    19'

20    32    30'

31'

30    32'    20

31

19    6    5    19'

3

2

1'

9

5

5                    6

31'        33'

32    17        34'

9                            9

34    34'

33

6        31

5

9

3

2

MICROMECHANICAL SENSOR ELEMENT

CROSS REFERENCE

The present application claims the benefit under 35 U.S.C. § 119 of German Patent Application No. 102020214019.7 filed on Nov. 9, 2020, which is expressly incorporated herein by reference in its entirety.

FIELD

The present invention relates to a micromechanical sensor element.

BACKGROUND INFORMATION

Some conventional micromechanical systems (MEMS) are available, with the aid of which a movement of a seismic mass may be verified. MEMS of this type may be designed, for example, as acceleration sensors or as rotation rate sensors. At least one seismic mass is usually freely movable suspended via a spring on a substrate. Movable electrodes are formed at the seismic mass. Anchored electrodes are formed on the substrate, which form capacitances together with the movable electrodes of the seismic mass. By a measurement of a capacitance, a position of the movable mass perpendicular to the electrode surfaces may be determined. Two oppositely working symmetrical electrode pairs are usually provided opposite the movable mass. A change in position or an absolute position of the seismic mass may be very accurately determined via an electronic circuit from a differential signal of the capacitances formed thereby.

A disadvantage of an arrangement of this type is, for example, that the substrate may bend due to a soldering operation when manufacturing the acceleration sensor and due to external influences. Since the seismic mass and the electrodes are not suspended at the same point on the substrate, this bending results in a displacement of the seismic mass relative to the fixed electrodes, which may not be differentiated from a present acceleration. An undesirable spurious signal thus occurs.

To reduce this effect, for example, anchorings of the fixed electrodes and the movable mass may be moved as close as possible toward each other, which requires an additional complexity and an additional use of space. For example, additional layers, which are associated with additional costs, are often necessary in the process, or nonlinearities must be taken into account, with unfavorable electrode arrangements resulting therefrom. Since the fixed electrodes must be electrically insulated from the movable electrodes, the anchorings may not be situated arbitrarily close to each other. The anchorings must furthermore be made smaller, the closer they are moved toward each other, and thus have an unstable design.

SUMMARY

An object of the present invention is to provide an improved micromechanical sensor element, which is insensitive to a substrate bending and whose manufacture is easier to implement. This object is achieved by a micromechanical sensor element in accordance with an example embodiment of the present invention. Advantageous refinements of the present invention are disclosed herein.

In accordance with an example embodiment of the present invention, a micromechanical sensor element includes a substrate, a first structure movably arranged on the substrate, a second structure movably arranged on the substrate and an electrode arrangement, situated on the substrate in a fixed manner, which includes at least one first electrode. The first movably arranged structure and the second movably arranged structure are coupled with each other by at least one coupling element in such a way that, upon a deflection of the first movably arranged structure along a first direction running in parallel to the substrate, the second movably arranged structure undergoes a deflection along an opposite direction. The first electrode includes a plurality of electrode surfaces. The first movably arranged structure includes a plurality of first movable electrode surfaces, and the second movably arranged structure includes a plurality of second movable electrode surfaces. The electrode surfaces of the substrate-fixed electrode arrangement and the movable electrode surfaces of the movably arranged structures engage with each other. The first movable electrode surfaces of the first movably arranged structure and the second movable electrode surfaces of the second movably arranged structure are each situated on sides of the electrode surfaces of the substrate-fixed electrode arrangement facing away from the movably arranged structures.

Due to the arrangement of the elements of the micromechanical sensor element, the first movable structure and the second movable structure are coupled with each other in such a way that the first movable electrode surfaces and the second movable electrode surfaces move together with a component perpendicular to the movable electrode surfaces in the direction of the substrate-fixed electrode surfaces upon a present acceleration, by means of which the active acceleration is detectable.

In accordance with an example embodiment of the present invention, it is advantageous that a displacement of an anchor point of the substrate-fixed electrode relative to an anchor point of the movable structures in a direction component perpendicular to the movable electrode surfaces, which occurs due to a bending of the substrate, results in an increase of the distance between the first movable electrode surfaces and the fixed electrode surfaces and in a decrease of the distance between the second movable electrode surfaces and the fixed electrode surfaces.

In a capacitive aggregate signal of the electrode, the increases and decreases of the aforementioned distances compensate for each other, by means of which no overall capacitance change takes place. It is therefore possible to compensate for an aligned displacement of the anchor points of the substrate-fixed electrode relative to the anchor point of the movable structure in a direction component perpendicular to the movable electrode surfaces, caused by a bending of the substrate or in another manner.

In one specific embodiment of the present invention, the electrode surfaces of the substrate-fixed electrode arrangement are situated to run essentially perpendicularly to the first direction. The electrode surfaces of the substrate-fixed electrode arrangement are situated to run essentially in parallel to the movable electrode surfaces. A more effective compensation of a displacement of the anchor points of the substrate-fixed electrodes relative to the anchor points of the movable masses may thereby advantageously take place in the capacitive aggregate signal. The micromechanical sensor element is thus characterized by a particularly low bending sensitivity. An acceleration measurement may thereby take place with a particularly small offset.

In one specific embodiment of the present invention, a first anchor point of the first electrode fixedly situated on the substrate is situated outside an area of the substrate which encompasses the first electrode. An acceleration measurement may thereby also advantageously take place with a particularly small offset.

In a further advantageous specific embodiment of the present invention, the first electrode includes a first electrode section and a second electrode section. The first electrode section and the second electrode section are connected to the substrate via a shared first anchor point. The first electrode section faces the first movably arranged structure, and the second electrode section faces the second movably arranged structure.

In one specific embodiment of the present invention, the coupling elements are designed as lever spring elements, each lever spring element including a lever subelement and a first, a second and a third spring subelement. Each lever subelement is connected to the substrate by a first spring subelement and via an anchor point. Each lever subelement is connected to the first movably arranged structure by a second spring subelement and to the second movably arranged structure by a third spring subelement. The lever spring elements are situated in such a way that at least one first lever subelement is situated to run along the first direction in a non-deflected state, and at least one second lever subelement is situated to run along a second direction running perpendicularly to the first direction in a non-deflected state. The lever spring elements are designed in such a way that the first lever subelement is tilted in a plane spanned by the first direction and the second direction in the case of an acceleration acting along the second direction, and the second lever subelement is tilted in the plane in the case of an acceleration acting along the first direction. The substrate-fixed electrode arrangement includes at least the first electrode for detecting deflections of the first movably arranged structure and the second movably arranged structure along the first direction, and includes at least one second electrode for detecting deflections of the first movably arranged structure and the second movably arranged structure along the second direction.

In one specific embodiment of the present invention, the first electrode and the second electrode each include a first electrode section and a second electrode section. The first electrode section and the second electrode section of the first electrode are connected to the substrate via a shared first anchor point, and the first electrode section and the second electrode section of the second electrode are connected to the substrate via a shared second anchor point. The first electrode sections each face the first movably arranged structure, and the second electrode sections face the second movably arranged structure. The electrode sections each include a plurality of electrode surfaces situated essentially perpendicularly to the plane spanned by the first direction and the second direction. Electrode surfaces of a first electrode section of an electrode are situated to run essentially in parallel to electrode surfaces of a second electrode section of the electrode. The first movably arranged structure includes a plurality of first movable electrode surfaces, and the second movably arranged structure includes a plurality of second movable electrode surfaces. The electrode surfaces of the substrate-fixed electrode arrangement and the movable electrode surfaces of the movably arranged structures engage with each other and are situated to run essentially in parallel to each other. The first movable electrode surfaces of the first movably arranged structure and the second movable electrode surfaces of the second movably arranged structure are each situated on sides of the electrode surfaces of the substrate-fixed electrode arrangement facing away from the movably arranged structures.

In one specific embodiment of the present invention, the micromechanical sensor element includes a third electrode fixedly situated on the substrate. The third electrode is situated in relation to the two movably arranged structures in such a way that a distance between the third electrode and the movably arranged structures is smaller than a distance between the first electrode and the movably arranged structures during a deflection of the movably arranged structures along the first direction. A differential evaluation of capacitive aggregate signals of the electrodes may advantageously take place. For example, a differential signal may be ascertained between the capacitive aggregate signals of the first and third electrodes.

In one specific embodiment of the present invention, the first movably arranged structure and the second movably arranged structure are coupled with each other and to the substrate by four lever spring elements. The electrode arrangement includes four electrodes, each including a first electrode section facing the first movably arranged structure, and including a second electrode section facing the second movably arranged structure, which are each connected to the substrate via shared anchor points. The electrode sections each include a plurality of electrode surfaces. The electrode surfaces of the first electrode and a third electrode are situated to run essentially in parallel to each other, and electrode surfaces of a second electrode and a fourth electrode are situated to run essentially in parallel to each other. The electrode surfaces of the substrate-fixed electrode arrangement and the movable electrode surfaces of the movably arranged structures engage with each other and are situated to run essentially in parallel to each other. The first movably arranged structure includes a plurality of third movable electrode surfaces, and the second movably arranged structure includes a plurality of fourth movable electrode surfaces. The movable electrode surfaces of the first movably arranged structure and the movable electrode surfaces of the second movably arranged structure are each situated on sides of the electrode surfaces of the substrate-fixed electrode arrangement facing away from the movably arranged structures. The lever spring elements are designed in such a way that the movably arranged structures move away from the third electrode and/or from the fourth electrode during a deflection in the direction of the first electrode and/or in the direction of the second electrode.

In accordance with an example embodiment of the present invention, a differential evaluation of capacitive aggregate signals of the electrodes may advantageously take place. For example, a first differential signal may be ascertained between the capacitive aggregate signals of the first and third electrodes and a second differential signal may be ascertained between the capacitive aggregate signals of the second and fourth electrodes.

In one specific embodiment of the present invention, the electrode arrangement includes at least one axis of symmetry running within a plane spanned by the first direction and the second direction. A more effective compensation of a displacement of the anchor points of the substrate-fixed electrodes relative to the anchor points of the movable masses may advantageously take place in the capacitive aggregate signal, due to a symmetrical electrode arrangement. The micromechanical sensor element is thus characterized by a particularly low bending sensitivity. An acceleration measurement may thereby take place with a particularly small offset.

In one specific embodiment of the present invention, an arrangement of the two movably arranged structures and the electrode arrangement includes at least one axis of symmetry running within the plane spanned by the first direction and the second direction. A more effective compensation of a displacement of the anchor points of the substrate-fixed electrodes relative to the anchor points of the movable structures may advantageously take place in the capacitive aggregate signal, due to a symmetrical arrangement of the movable structures and the electrode arrangement.

In one specific embodiment of the present invention, an arrangement of the anchor points includes at least one axis of symmetry running within the plane spanned by the first direction and the second direction. The bending sensitivity of the micromechanical sensor element may be advantageously reduced thereby.

In one specific embodiment of the present invention, the movably arranged structures are situated and coupled with each other in such a way that deflection amplitudes of the movably arranged structures are of the same size in the case of an acceleration acting perpendicularly to the electrode surfaces. As a result, a compensation in the capacitive aggregate signal may advantageously take place more efficiently.

In one specific embodiment of the present invention, the electrodes are each situated in areas of the lever spring elements at least in sections. The acceleration sensor may advantageously be provided with a particularly compact design thereby.

In one specific embodiment of the present invention, anchor points of the movably arranged structures and the electrode arrangement are situated in surroundings of a center of gravity of the micromechanical sensor element. In this variant, the anchor points are situated near the center of gravity and near each other. This allows a displacement of the anchor points of the substrate-fixed electrodes relative to the anchor points of the movable structures to be kept small, by means of which the bending sensitivity of the micromechanical sensor element may be reduced.

BRIEF DESCRIPTION OF EXAMPLE EMBODIMENTS

The features and advantages of the present invention described above are made clearer and more understandable in connection with the following description of the exemplary embodiments, which are explained in greater detail in connection with the schematic figures.

DETAILED DESCRIPTION OF EXAMPLE EMBODIMENTS

Figure 1:
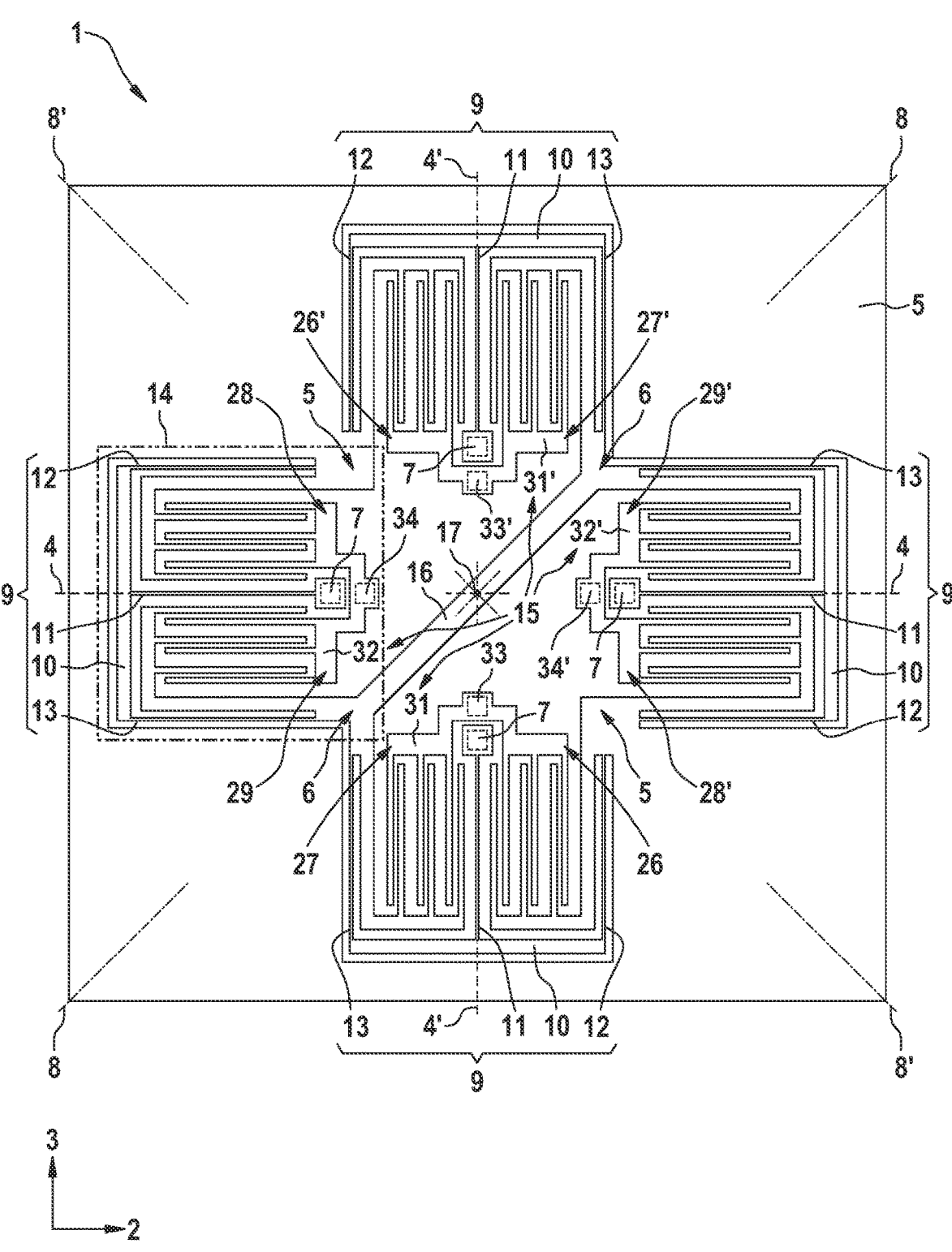
FIG. 1 shows a top view of a micromechanical sensor element, in accordance with an example embodiment of the present invention.

FIG. 1 shows a schematic top view of a micromechanical sensor element 1. Micromechanical sensor element 1 is designed to detect occurring accelerations at least along one first direction 2 and optionally additionally also along a second direction 3 running perpendicularly to first direction 2. In this case, micromechanical sensor element 1 may also be referred to as XY acceleration sensor 1.

Micromechanical sensor element 1 includes a substrate, which is not shown in FIG. 1. A plane spanned by the two directions 2, 3 corresponds to a main extension plane of the substrate. The elements shown in FIG. 1 are situated on and/or above the substrate and may be manufactured by semiconductor manufacturing technologies. The elements shown in FIG. 1 may include, for example, silicon.

Micromechanical sensor element 1 includes a first structure 5 movably arranged on the substrate and a second structure 6 movably arranged on the substrate. For example, first movably arranged structure 5 is designed as heavy seismic mass 5. Similarly, for example, second movably arranged structure 6 is designed as light seismic mass 6. However, the opposite may also apply. In the following description, it is always assumed that first structure 5 is designed as heavy mass 5, and second structure 6 is designed as light mass 6.

Heavy mass 5 and light mass 6 are designed to be movable. Micromechanical sensor element 1 may alternatively include an arbitrary even number of movable masses 5, 6. Light mass 6 includes two segments, which are connected to each other via a web 16. Web 16 is situated via a center of gravity 17 past acceleration sensor 1. It is alternatively possible to not connect the two segments of light mass 6 to each other past center of gravity 17. For example, light mass 6 may include two separate segments, which are not connected to each other via web 16. The segments also do not necessarily have to be connected to each other. Instead, for example, the separate segments may together take on the function of light mass 6. Heavy mass 5 also includes two segments, which, however, are not connected to each other past center of gravity 17, but are instead connected to each other with the aid of a frame surrounding light mass 6. Heavy mass 5 and light mass 6 may also include a different number of segments. However, a segmentation of masses 5, 6 is not absolutely necessary. For example, heavy mass 5 may also include only one segment.

Heavy mass 5 and light mass 6 are coupled with each other and to the substrate by four coupling elements 9, which are designed, for example, as lever spring elements 9, by means of which the two masses 5, 6 are designed to be deflectable relative to each other and relative to the substrate. Lever spring elements 9 are thus provided as suspensions for movable masses 5, 6. Acceleration sensor 1 may also include a different number of coupling elements 9. Light mass 6 and heavy mass 5 are, however, movably coupled with each other and to the substrate at least by two coupling elements 9. Lever spring elements 9 are situated in such a way that at least one first lever subelement 10 is situated to run along first direction 2 in a non-deflected state, and at least one second lever subelement 10 is situated to run along second direction 3 in a non-deflected state.

Each lever spring element 9 includes a lever subelement 10, a first spring subelement 11, a second spring subelement 12 and a third spring subelement 13. First spring subelements 11 are situated, for example, in the middle of lever subelements 10 and connected thereto. As a result, lever spring elements 9 are provided with a symmetrical design. However, this is not absolutely necessary. Lever spring elements 9 couple the two masses 5, 6 with each other and to the substrate in the following manner: Each lever subelement 10 is anchored or connected to the substrate by a first spring subelement 11 and via an anchor point 7. First spring subelement 11 is used as a torsion spring and as a flexible spring. A second spring subelement 12 is also situated at a first end of a lever subelement 10, which is coupled with or connected to heavy mass 5. A third spring subelement 13 is situated at a second end of lever subelement 10, which is coupled with light mass 6. Second and third spring subelements 12, 13 are also each used as torsion springs and as flexible springs.

Micromechanical sensor element 1 includes a substrate-fixed electrode arrangement 15, including at least one first electrode 31 for detecting deflections of light mass 6 and heavy mass 5 along first direction 2, and optionally including at least one second electrode 32 for detecting deflections of light mass 6 and heavy mass 5 along second direction 3. Since micromechanical sensor element 1 according to the exemplary specific embodiment in FIG. 1 includes a total of four coupling elements 9, electrode arrangement 15 correspondingly includes four electrodes 31, 32, 31', 32', a third electrode 31' being provided for detecting deflections of light mass 6 and heavy mass 5 along first direction 2, and a second electrode 32' being provided for detecting deflections of light mass 6 and heavy mass 5 along second direction 3. In the exemplary specific embodiment, electrodes 31, 31', 32, 32' are each situated completely within the area of lever spring elements 9. As a result, micromechanical sensor element 1 has a particularly compact design. However, this is not absolutely necessary. Electrodes 31, 31', 32, 32' may, for example, also each be situated in areas of spring lever elements 9, at least in sections.

First electrode 31 includes a first electrode section 26 and a second electrode section 27. Second electrode 32 includes a first electrode section 28 and a second electrode section 29. First electrode section 26 and second electrode section 27 of first electrode 31 are connected to the substrate via a shared first anchor point 33. First electrode section 28 and second electrode section 29 of second electrode 32 are connected to the substrate via a shared second anchor point 34. First electrode sections 26, 28 each face heavy mass 5, and second electrode sections 27, 29 each face light mass 6.

Correspondingly, third electrode 31' includes a first electrode section 26' and a second electrode section 27'. Fourth electrode 32' also includes a first electrode section 28' and a second electrode section 29'. First electrode section 26' and second electrode section 27' of third electrode 31' are connected to the substrate via a shared third anchor point 33'. First electrode section 28' and second electrode section 29' of fourth electrode 32' are connected to the substrate via a shared fourth anchor point 34'. First electrode sections 26', 28' each face heavy mass 5, and second electrode sections 27', 29' each face light mass 6.

Micromechanical sensor element 1 includes, for example, a plurality of axes of symmetry 4, 4', 8, 8'. For example, electrode arrangement 15 includes four axes of symmetry 4, 4', 8, 8' running within the plane spanned by first direction 2 and second direction 3. A first axis of symmetry 4 runs in parallel to first direction 2 and through center of gravity 17 of acceleration sensor 1. A second axis of symmetry 4' runs in parallel to second direction 3 and through center of gravity 17 of acceleration sensor 1. A third axis of symmetry 8 runs at a 45° angle with respect to first and second directions 2, 3 and through center of gravity 17. A fourth axis of symmetry 8' runs at a 45° angle with respect to first and second directions 2, 3 through center of gravity 17 and runs perpendicularly to third axis of symmetry 8. A further symmetry of micromechanical sensor element 1 is that an arrangement of the two masses 5, 6 and electrode arrangement 15 is symmetrical with respect to third and fourth axes of symmetry 8, 8'. An arrangement of anchor points 7, 33, 34, 33', 34' is symmetrical with respect to all four axes of symmetry 4, 4', 8, 8'. However, micromechanical sensor element 1 does not necessarily include axes of symmetry 4, 4', 8, 8'.

Figure 2:
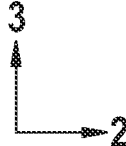
FIG. 2 shows a detailed representation of the micromechanical sensor element from FIG. 1 in the area of a lever spring element, in accordance with an example embodiment of the present invention.

FIG. 2 shows an enlarged representation of one part of micromechanical sensor element 1 in the area of a lever spring element 9. For example, FIG. 2 shows only an area 14 marked in FIG. 1, within which second electrode 32 is situated. The features of micromechanical sensor element 1 described below result from the symmetry observations described above also for remaining lever spring elements 9 or electrodes 31, 31', 32'.

Electrode sections 26, 27, 28, 29 of first and second electrodes 31, 32 each include a plurality of electrode surfaces 19 situated essentially perpendicularly to the plane spanned by first direction 2 and second direction 3. Electrode surfaces 19 of a first electrode section 26, 28 of an electrode 31, 32 are situated to run essentially in parallel to electrode surfaces 19 of a second electrode section 27, 29 of electrode 31, 32. Heavy mass 5 includes a plurality of first movable electrode surfaces 20, and light mass 6 includes a plurality of second movable electrode surfaces 30. Electrode surfaces 19 of substrate-fixed electrode arrangement 15 and movable electrode surfaces 20, 30 of masses 5, 6 engage with each other and are situated to run essentially in parallel to each other. Electrode surfaces 19 of first electrode sections 26, 28 form capacitances, together with first movable electrode surfaces 20 of heavy mass 5. Electrode surfaces 19 of second electrode sections 27, 29 form capacitances, together with second movable electrode surfaces 30 of light mass 6.

Correspondingly, electrode sections 26', 27', 28', 29' each include a plurality of electrode surfaces 19'. Electrode surfaces 19, 19' of first electrode 31 and third electrode 31' are situated to run essentially in parallel to each other. Electrode surfaces 19, 19' of second electrode 32 and fourth electrode 32' are also situated to run essentially in parallel to each other. Heavy mass 5 includes a plurality of third movable electrode surfaces 20', and light mass 6 includes a plurality of fourth movable electrode surfaces 30'. Electrode surfaces 19 of substrate-fixed electrode arrangement 15 and movable electrode surfaces 20', 30' of masses 5, 6 engage with each other and are situated to run, for example, essentially in parallel to each other. Electrode surfaces 19' of first electrode sections 26', 28' of third and fourth electrodes 31', 32' form capacitances, together with third movable electrode surfaces 20' of heavy mass 5. Electrode surfaces 19' of second electrode sections 27', 29' of third and fourth electrodes 31', 32' form capacitances, together with fourth movable electrode surfaces 30' of light mass 6.

Figure 3:
FIG. 3 shows an operating principle of the micromechanical sensor element from FIG. 1, in accordance with an example embodiment of the present invention.

Lever spring elements 9 are designed in such a way that first lever subelement 10 is tilted in a plane spanned by first direction 2 and second direction 3 in the case of an acceleration acting along second direction 3, and second lever subelement 10 is tilted in the plane in the case of an acceleration acting along first direction 2. FIG. 3 shows micromechanical sensor element 1, an acceleration acting in parallel to second direction 3, for example. Lever subelements 10 of first electrode 31 and third electrode 31' are tilted thereby.

In general, upon an acceleration of the substrate, the movement is transferred to lever subelement 10 via first spring subelement 11 and, in turn, to heavy mass 5 via lever subelement 10 and second spring subelement 12 connected thereto. Heavy mass 5 offers a resistance to the acceleration, due to its inertia, so that a torque acts upon a section of lever subelement 10, which is formed between first spring subelement 11 and second spring subelement 12. Conversely, light mass 6 also offers a resistance to the acceleration and thus generates a torque at a section of lever subelement 10, which is formed between first spring subelement 11 and third spring subelement 13, which opposes the torque generated by heavy mass 5 and is smaller in comparison thereto. A resulting net torque, which sets in at the first connecting point, results in a tilting of lever subelement 10. Light mass 6 and heavy mass 5 may be situated and coupled with each other in such a way that, in the case of an acceleration acting perpendicularly to electrode surfaces 19, 19', deflection amplitudes of masses 5, 6 are of the same size, which does not necessarily have to be the case.

As is illustrated, for example, in FIG. 3, lever spring elements 9 are designed in such a way that heavy and light masses 5, 6 move away from third electrode 31' and/or from fourth electrode 32' upon a deflection in the direction of first electrode 31 and/or in the direction of second electrode 32. Since micromechanical sensor element 1 in FIG. 3 is shown with an acceleration acting in parallel to second direction 3, heavy mass and light mass 5, 6, however, move away from fourth electrode 32' in the direction of second electrode 32. As a result, distances between electrode surfaces 19 of substrate-fixed second electrode 32 and first and second movable electrode surfaces 20, 30 become smaller, while distances between electrode surfaces 19' of substrate-fixed fourth electrode 32' and third and fourth movable electrode surfaces 20', 30' become larger. As a result, a differential evaluation of a sensor signal of acceleration sensor 1 may take place. However, this is not absolutely necessary. Lever spring elements 9 do not have to be designed in such a way that heavy and light masses 5, 6 move away from third electrode 31' and/or from the fourth electrode 32' upon a deflection in the direction of first electrode 31 and/or in the direction of second electrode 32.

The substrate of micromechanical sensor element 1 may bend, for example due to a soldering operation during the manufacture of micromechanical sensor element 1 and/or due to external influences. Since seismic masses 5, 6 and electrodes 31, 31', 32, 32' are not suspended at the same point at the substrate, this bending results in a displacement of seismic masses 5, 6 relative to fixed electrodes 31, 31', 32, 32', which is indistinguishable from a present acceleration. To overcome the disadvantage that micromechanical sensor element 1 supplies a spurious signal in the case of a bending of the substrate, movable electrode surfaces 20, 20' of heavy mass 5 and movable electrode surfaces 30, 30' of light mass 6 are each situated on sides 35 of electric surfaces 19, 19' of substrate-fixed electrode arrangement 15 facing away from masses 5, 6.

Figure 4:
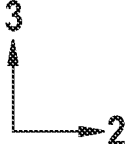
FIG. 4 shows the micromechanical sensor element from FIG. 1, including a bending of the substrate, in accordance with an example embodiment of the present invention.

FIG. 4 shows area 14 of second electrode 32, second anchor point 34 being displaced, for example, along second direction 3 relative to an anchor point 7, which is connected to a first spring subelement 11, as indicated with the aid of an arrow 18. However, the following description also applies similarly to remaining electrodes 31, 31', 32'.

Since electrode sections 28, 29 of second electrode 32 are anchored at shared second anchor point 34, a displacement of second anchor point 34 relative to anchor point 7 results in distances between electrode surfaces 19 of first electrode section 28 and first movable electrode surfaces 20 increasing, while distances between electrode surfaces 19 of second electrode section 29 and second movable electrode surfaces 30 decrease. As a result, in capacitive aggregate signal over second electrode 32, a spurious signal may be advantageously averaged out, which occurs due to a bending of the substrate. Similarly, spurious signals due to a bending of the substrate may be averaged out in this manner in capacitive aggregate signals of remaining electrodes 31, 31', 32'. As a result, micromechanical sensor element 1 may be less sensitive to a bending of the substrate. A symmetrical electrode arrangement 15 and/or a symmetrical arrangement of the two masses 5, 6 combined with electrode arrangement 15 and/or a symmetrical arrangement of anchor points 7, 33, 34, 33', 34' offer the advantage that the bending sensitivity of micromechanical sensor element 1 may be additionally reduced.

Figure 5:
FIG. 5 shows a top view of a further micromechanical sensor element, in accordance with an example embodiment of the present invention.

FIG. 5 shows a schematic top view of a further micromechanical sensor element 1'. Further micromechanical sensor element 1' has great similarities with micromechanical sensor element 1 according to FIG. 1. Identical element or elements of a similar design are provided with the same reference numerals in the following description. Only the differences are explained below.

In contrast to micromechanical sensor element 1 according to FIG. 1, the segments of light mass 6 of further micromechanical sensor 1' are not connected to each other via web 16. In further micromechanical sensor element 1', anchor points 7, 33, 33', 34, 34' are also arranged in surroundings of center of gravity 17. First spring subelements 11 each run away from center of gravity 17 in the direction of a lever subelement 10. Due to the arrangement of anchor points 7, 33, 33', 34, 34' near center of gravity 17 of further micromechanical sensor element 1', the bending sensitivity thereof may be further reduced, since a displacement of anchor points 7, 33, 33', 34, 34' relative to each other in the case of a displacement of the substrate is dependent on a distance of anchor points 7, 33, 33', 34, 34' in relation to each other.

What is claimed is:

1. A micromechanical sensor element, comprising:
a substrate;
a first movably arranged structure movably arranged on the substrate;
a second movably arranged structure movably arranged on the substrate; and
a substrate-fixed electrode arrangement situated on the substrate in a fixed manner, the substrate-fixed electrode arrangement including at least one first electrode;
wherein:
the first movably arranged structure and the second movably arranged structure are coupled with each other by coupling elements in such a way that, upon a deflection of the first movably arranged structure along a first direction running in parallel to the substrate, a portion of the second movably arranged structure undergoes a deflection along an opposite direction;
the at least one first electrode includes a plurality of electrode surfaces;
the first movably arranged structure includes a plurality of first movable electrode surfaces, and the second movably arranged structure includes a plurality of second movable electrode surfaces;
the plurality of electrode surfaces of the substrate-fixed electrode arrangement and the first and second movable electrode surfaces of the first and second movably arranged structures engage with each other;
the first movable electrode surfaces of the first movably arranged structure and the second movable electrode surfaces of the second movably arranged structure being each situated on sides of the plurality of electrode surfaces of the substrate-fixed electrode arrangement facing away from the first and second movably arranged structures,
wherein:
the at least one first electrode includes a first electrode section and a second electrode section;
the first electrode section and the second electrode section are connected to the substrate via a shared first anchor point, wherein a displacement of the shared first anchor point relative to another anchor point results in distances between electrode surfaces of the first electrode section and the first movable electrode surfaces increasing, while distances between electrode surfaces of the second electrode section and the second movable electrode surfaces decrease;
the first electrode section faces the first movably arranged structure, and the second electrode section faces the second movably arranged structure.

2. The micromechanical sensor element as recited in claim 1, wherein the plurality of electrode surfaces of the substrate-fixed electrode arrangement are situated to run perpendicularly to the first direction, and the plurality of electrode surfaces of the substrate-fixed electrode arrangement being situated to run in parallel to the movable electrode surfaces.

3. The micromechanical sensor element as recited in claim 1, wherein a first anchor point of the at least one first electrode fixedly situated on the substrate is situated outside an area of the substrate which encompasses the at least one first electrode.

4. The micromechanical sensor element as recited in claim 1, wherein:
each of the coupling elements is a lever spring element, each lever spring element including a lever subelement and a respective first, a respective second and a respective third spring subelement;
each lever subelement is connected to the substrate by the respective first spring subelement and via an anchor point;
each lever subelement is connected to the first movably arranged structure by the respective second spring subelement and to the second movably arranged structure by the respective third spring subelement;
each lever spring element is situated in such a way that at least one respective first lever subelement is situated to run along the first direction in a non-deflected state, and at least one respective second lever subelement is situated to run along a second direction running perpendicularly to the first direction in a non-deflected state;
each lever spring element is configured in such a way that the respective first lever subelement is tilted in a plane spanned by the first direction and the second direction when an acceleration acts along the second direction, and the respective second lever subelement is tilted in the plane when an acceleration acts along the first direction;
the substrate-fixed electrode arrangement includes at least the at least one first electrode configured to detect deflections of the first movably arranged structure and the second movably arranged structure along the first direction, and including at least one second electrode configured to detect deflections of the first movably arranged structure and the second movably arranged structure along the second direction.

5. The micromechanical sensor element as recited in claim 4, wherein:
the at least one first electrode and the at least one second electrode each include a first electrode section and a second electrode section;
the first electrode section and the second electrode section of the first electrode are connected to the substrate via a shared first anchor point, and the first electrode section and the second electrode section of the at least one second electrode are connected to the substrate via a shared second anchor point;
the first electrode sections of the at least one first and second electrodes each faces the first movably arranged structure, and the second electrode sections of the at least one first and second electrodes each face the second movably arranged structure;
the first and second electrode sections of the at least one first and second electrode each include a plurality of electrode surfaces situated perpendicularly to a plane spanned by the first direction and the second direction;
the electrode surfaces of each of the first electrode sections of the at least one first and second electrode are situated to run in parallel to the electrode surfaces of the second electrode sections of the at least one first and second electrodes, the first movably arranged structure including a plurality of first movable electrode surfaces, and the second movably arranged structure including a plurality of second movable electrode surfaces;
the plurality of electrode surfaces of the substrate-fixed electrode arrangement and the first and second movable electrode surfaces of the first and second movably arranged structures engage with each other and are situated to run in parallel to each other;
the first movable electrode surfaces of the first movably arranged structure and the second movable electrode surfaces of the second movably arranged structure being each situated on sides of the plurality of electrode surfaces of the substrate-fixed electrode arrangement facing away from the movably arranged structures.

6. The micromechanical sensor element as recited in claim 1, further comprising:
a third electrode situated in a fixed manner, wherein the third electrode is situated in relation to the first and second movably arranged structures in such a way that a distance between the third electrode and each of the first and second movably arranged structures is smaller than a distance between the at least one first electrode and the first and second movably arranged structures upon a deflection of the first and second movably arranged structures along the first direction.

7. The micromechanical sensor element as recited in claim 1, wherein:
the first movably arranged structure and the second movably arranged structure are coupled with each other and to the substrate by four lever spring elements, the electrode arrangement includes four electrodes which each include a first electrode section facing the first movably arranged structure and a second electrode section facing the second movably arranged structure, which are each connected to the substrate via shared anchor points;
the electrode sections each include a plurality of electrode surfaces;
the electrode surfaces of the at least one first electrode and a third electrode being situated to run in parallel to each other, and the electrode surfaces of a second electrode and a fourth electrode being situated to run in parallel to each other, the plurality of electrode surfaces of the substrate-fixed electrode arrangement and the movable electrode surfaces of the movably arranged structures engaging with each other and being situated to run in parallel to each other;

the first movably arranged structure includes a plurality of third movable electrode surfaces, and the second movably arranged structure includes a plurality of fourth movable electrode surfaces;

the first and third movable electrode surfaces of the first movably arranged structure and the second and fourth movable electrode surfaces of the second movably arranged structure are each situated on sides of the plurality of electrode surfaces of the substrate-fixed electrode arrangement facing away from the first and second movably arranged structures, the lever spring elements being designed in such a way that the first and second moveably arranged structures move away from the third electrode and/or from the fourth electrode upon a deflection in a direction of the at least one first electrode and/or in a direction of the second electrode.

8. The micromechanical sensor element as recited in claim 1, wherein the substrate-fixed electrode arrangement includes at least one axis of symmetry running within a plane spanned by the first direction and the second direction.

9. The micromechanical sensor element as recited in claim 1, wherein an arrangement of the first and second movably arranged structures and the substrate-fixed electrode arrangement includes at least one axis of symmetry running within a plane spanned by the first direction and the second direction.

10. The micromechanical sensor element as recited in claim 5, wherein an arrangement of the anchor point and the shared first and shared second anchor points includes at least one axis of symmetry running within a plane spanned by the first direction and the second direction.

11. The micromechanical sensor element as recited in claim 1, wherein the first and second movably arranged structures are situated and coupled with each other in such a way that deflection amplitudes of the first and second movably arranged structures are of the same size when an acceleration acts perpendicularly to the electrode surfaces.

12. The micromechanical sensor element as recited in claim 7, wherein the first, second, third, and fourth electrodes are each situated in areas of the lever spring elements, at least in sections.

13. The micromechanical sensor element as recited in claim 1, wherein anchor points of the first and second movably arranged structures and the substrate-fixed electrode arrangement are situated in surroundings of a center of gravity of the micromechanical sensor element.

* * * * *